(12) United States Patent
Hiraoka

(10) Patent No.: US 8,281,342 B2
(45) Date of Patent: Oct. 2, 2012

(54) DIGITAL BROADCAST RECEIVING APPARATUS

(75) Inventor: Michiaki Hiraoka, Kanagawa (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 11/569,657

(22) PCT Filed: May 27, 2005

(86) PCT No.: PCT/JP2005/009750
§ 371 (c)(1),
(2), (4) Date: Feb. 25, 2008

(87) PCT Pub. No.: WO2005/117423
PCT Pub. Date: Dec. 8, 2005

(65) Prior Publication Data
US 2011/0072459 A1    Mar. 24, 2011

(30) Foreign Application Priority Data
May 31, 2004 (JP) ............................... P.2004-160986

(51) Int. Cl.
*H04N 7/16* (2011.01)
(52) U.S. Cl. ............................... 725/62; 725/37; 725/38
(58) Field of Classification Search ...................... 725/62
See application file for complete search history.

(56) References Cited

U.S. PATENT DOCUMENTS 5,444,456 A * 8/1995 Ohta et al. ...................... 345/39
5,592,213 A * 1/1997 Yoshinobu et al. ........... 725/131
2003/0003899 A1 * 1/2003 Tashiro et al. ................ 455/414
2005/0066370 A1 * 3/2005 Alvarado et al. ............... 725/80
2005/0108400 A1 * 5/2005 Kujawski ...................... 709/227

FOREIGN PATENT DOCUMENTS

| JP | 6-77779 | | 3/1994 |
| JP | 8-130661 | | 5/1996 |
| JP | 8130661 | * | 5/1996 |
| JP | 09065206 A | * | 3/1997 |
| JP | 9-154076 | | 6/1997 |
| JP | A-10-4449 | | 1/1998 |
| JP | A-11-284712 | | 10/1999 |
| JP | 2002-009920 | | 1/2002 |
| JP | 2003-274310 | | 9/2003 |
| JP | 2003-274310 A | * | 9/2003 |
| JP | A-2003-309639 | | 10/2003 |
| JP | 2004-228724 | | 8/2004 |
| JP | 2004-266602 | | 9/2004 |
| JP | 2005-26769 | | 1/2005 |
| JP | 2005-45350 | | 2/2005 |

OTHER PUBLICATIONS

Office Action dated May 1, 2007 in Japanese Patent Application No. 2004-160986.
JP Office Action dated Sep. 4, 2007 for corresponding JP Patent Application No. 2004-160986.

* cited by examiner

*Primary Examiner* — Brian Pendleton
*Assistant Examiner* — Cai Chen
(74) *Attorney, Agent, or Firm* — Procopio, Cory, Hargreaves & Savitch LLP

(57) ABSTRACT

A tuner part 101 for receiving broadcast waves of a channel specified, a key operation part 111 including plural channel selection buttons B corresponding to channels, and a control part 116 for performing control so as to be able to visually distinguish a channel selection button B corresponding to a channel capable of being received by the tuner part 101 from other channel selection buttons B among the plurality of channel selection buttons B are provided, so that notification of a receivable channel can be provided surely.

20 Claims, 11 Drawing Sheets

FIG. 4

| CH | TELEVISION STATION | RECEPTION STATE |
|---|---|---|
| 1 | A BROADCAST | ◯ |
| 3 | B TELEVISION | ◯ |
| 4 | TELEVISION C | △ |
| 5 | TELEVISION D | ✕ |
| ⋮ | ⋮ | ⋮ |

DC

DIGITAL BROADCAST RECEIVING APPARATUS

TECHNICAL FIELD

The present invention relates to a digital broadcast receiving apparatus such as a mobile telephone or a PDA (Personal digital assistant) capable of receiving digital broadcasting.

BACKGROUND ART

In recent years, a technique for incorporating a television tuner in a mobile telephone device has been known (for example, see JP-A-2002-9920).

Also, in a terrestrial digital method or satellite digital broadcasting, broadcasting using a transmission band of 1 or 3 segments, mainly for a small receiver with high portability, is scheduled.

Patent Reference 1: JP-A-2002-9920

DISCLOSURE OF THE INVENTION

Problems that the Invention is to Solve

However, in terrestrial digital broadcasting, the sending and receiving performance depends on geographical conditions such as a landform. Depending on an area, radio waves of the same channel are received from separate broadcast stations, so that phenomena in which, for example, a reception screen is distorted due to interference occur. Therefore, radio waves are sent by assigning different channels (frequencies) to each of the broadcast stations according to a location, so that interference does not occur.

The occurrence of interference can thus be prevented, but such a broadcast system is unsuitable for mobility which is a basic property of a portable terminal. For example, in the area visited for the first time, reception channels of television broadcasting or radio broadcasting are not known, so that a program which a user wants to view may be missed.

As a result of this, a digital broadcast-receiving apparatus capable of surely providing notification of a receivable channel is desired.

The invention has been implemented in view of such circumstances, and an object of the invention is to provide a digital broadcast receiving apparatus capable of surely providing notification of a receivable channel.

Means for Solving the Problems

The gist of a digital broadcast receiving apparatus of the invention for solving the problems described above is in the following (1) to (7).

(1) A digital broadcast receiving apparatus comprising:
    a receiver for receiving broadcast waves of specified channels,
    a plurality of channel selection buttons corresponding to the channels, and
    a control portion for controlling so as to be able to visually distinguish channel selection buttons corresponding to channels capable of being received by the receiver from other channel selection buttons among the plurality of channel selection buttons.

(2) The digital broadcast receiving apparatus comprising:
    light emitting portions provided in correspondence with the channel selection buttons,
wherein the control portion makes the light emitting portions emit light to illuminate the channel selection buttons corresponding to the channels capable of being received by the receiver.

(3) The digital broadcast receiving apparatus comprising:
    a display portion,
wherein the control portion controls so as to be able to visually distinguish a channel selection button corresponding to a channel being displayed on the display portion from the other channel selection buttons, among the channel selection buttons corresponding to the channels capable of being received by the receiver.

(4) The digital broadcast receiving apparatus comprising:
    a detection portion for detecting a change of a reception area,
wherein when the detection portion detects the change, the control portion makes the light emitting portions of the channel selection buttons corresponding to channels capable of being received by the receiver in the changed area emit light.

(5) In the digital broadcast receiving apparatus, when a channel scan for detecting the channels capable of being received by the receiver is executed, the control portion makes the display portion display the channels capable of being received by the receiver and information related to broadcast stations of the channels in association with each other:

(6) In the digital broadcast receiving apparatus, the control portion makes the light emitting portion corresponding to the channel emit light at a light emission intensity in response to a reception state of the broadcast waves of each of the channels by the receiver.

(7) In the digital broadcast receiving apparatus, the light emitting portions emit light in a plurality of different colors, and
    the control portion makes the light emitting portion corresponding to the channel emit light in a color that corresponds to the reception state of the broadcast waves of each of the channels by the receiver.

Effect of the Invention

According to (1) to (7) described above, a digital broadcast receiving apparatus capable of surely providing notification of a receivable channel can be provided.

BRIEF DESCRIPTION OF THE DRAWINGS

FIG. 4 is a diagram showing one specific example of channel information in response to a channel scan result of the mobile telephone shown in FIG. 1.

DESCRIPTION OF REFERENCE NUMERALS AND SIGNS

Figure 1:
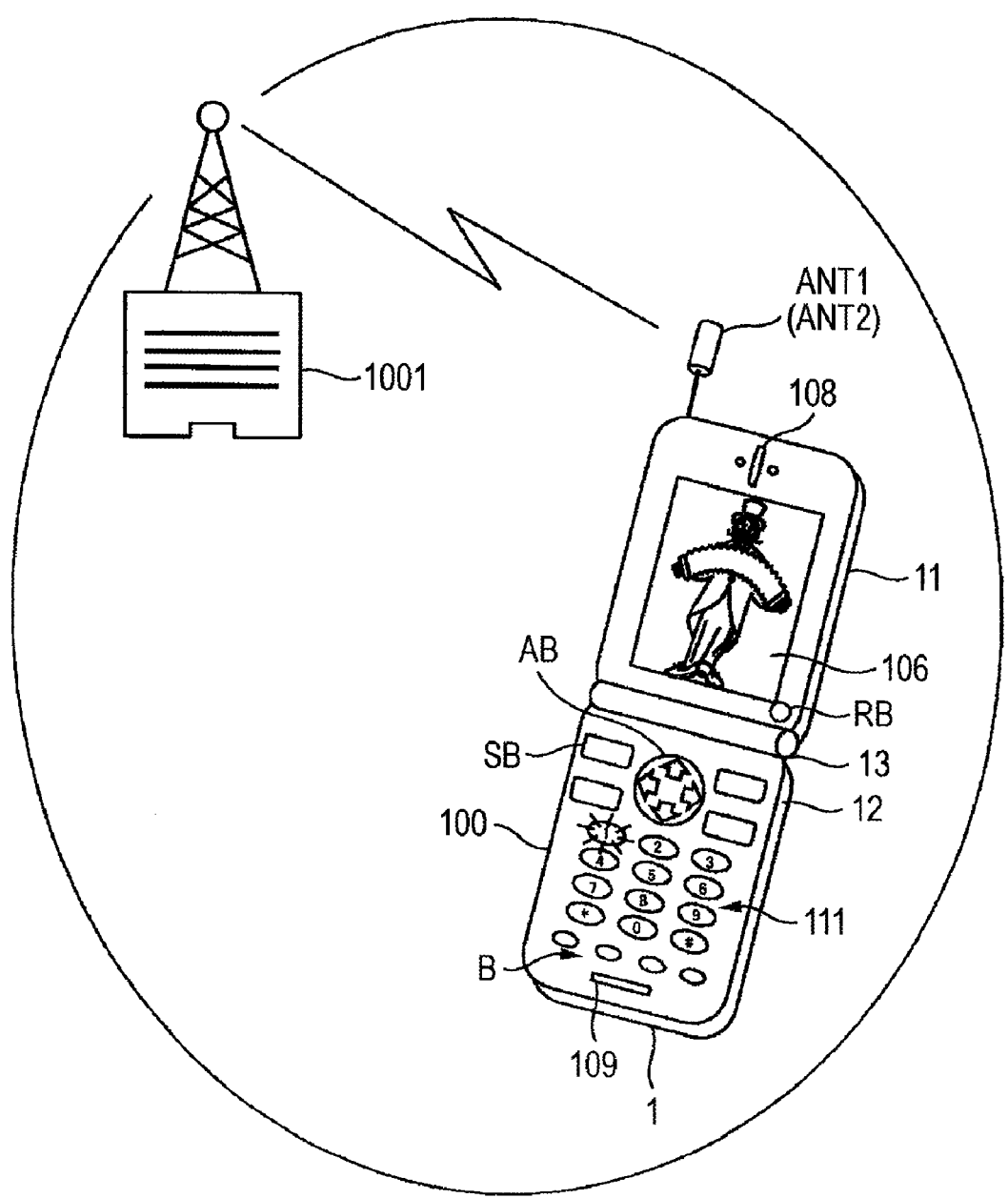
FIG. 1 is an overall diagram of a communication system 1000 in which a digital broadcast receiving apparatus according to a first embodiment of the invention is adopted.

In addition, in FIGS. 1 to 11, numeral 100 is a digital broadcast receiving apparatus (mobile telephone), numeral 101 is a tuner part, numeral 102 is a demodulation part, numeral 103 is a demultiplexing part, numeral 104 is an image processing part, numeral 105 is a data processing part, numeral 106 is a sound processing part, numeral 107 is a channel scan part, numeral 108 is a display part, numeral 109 is a voice receiving part, numeral 110 is a voice transmitting part, numeral 111 is a communication part, numeral 112 is a key operation part, numeral 113 is a light emitting part, numeral 114 is a light emission adjusting part, numeral 115 is a memory, numeral 116 is a control part, and numeral 117 is an area detection part.

BEST MODE FOR CARRYING OUT THE INVENTION

FIG. 1 is an overall diagram of a communication system 1000 in which a digital broadcast receiving apparatus according to a first embodiment of the invention is adopted.

A digital broadcast receiving apparatus 100 according to the present embodiment has a function of receiving digital broadcast waves of, for example, television broadcasting or radio broadcasting sent from a broadcast station 1001 or a relay station, and performs control so as to be able to visually distinguish a channel selection button corresponding to a receivable channel from the other channel selection buttons among the plurality of channel selection buttons.

For example, the digital broadcast receiving apparatus 100 performs control so that the light emitting portion emits light and a channel selection button corresponding to a receivable channel is illuminated to be visually distinguishable.

For example, the digital broadcast receiving apparatus is a digital broadcast receiving apparatus for a mobile unit such as a mobile telephone, a PDA and a car navigation apparatus.

A mobile telephone 100 will be described as the digital broadcast receiving apparatus in the present embodiment.

The mobile telephone 100 according to present embodiment will be described below with reference to the drawings.

Figure 2:
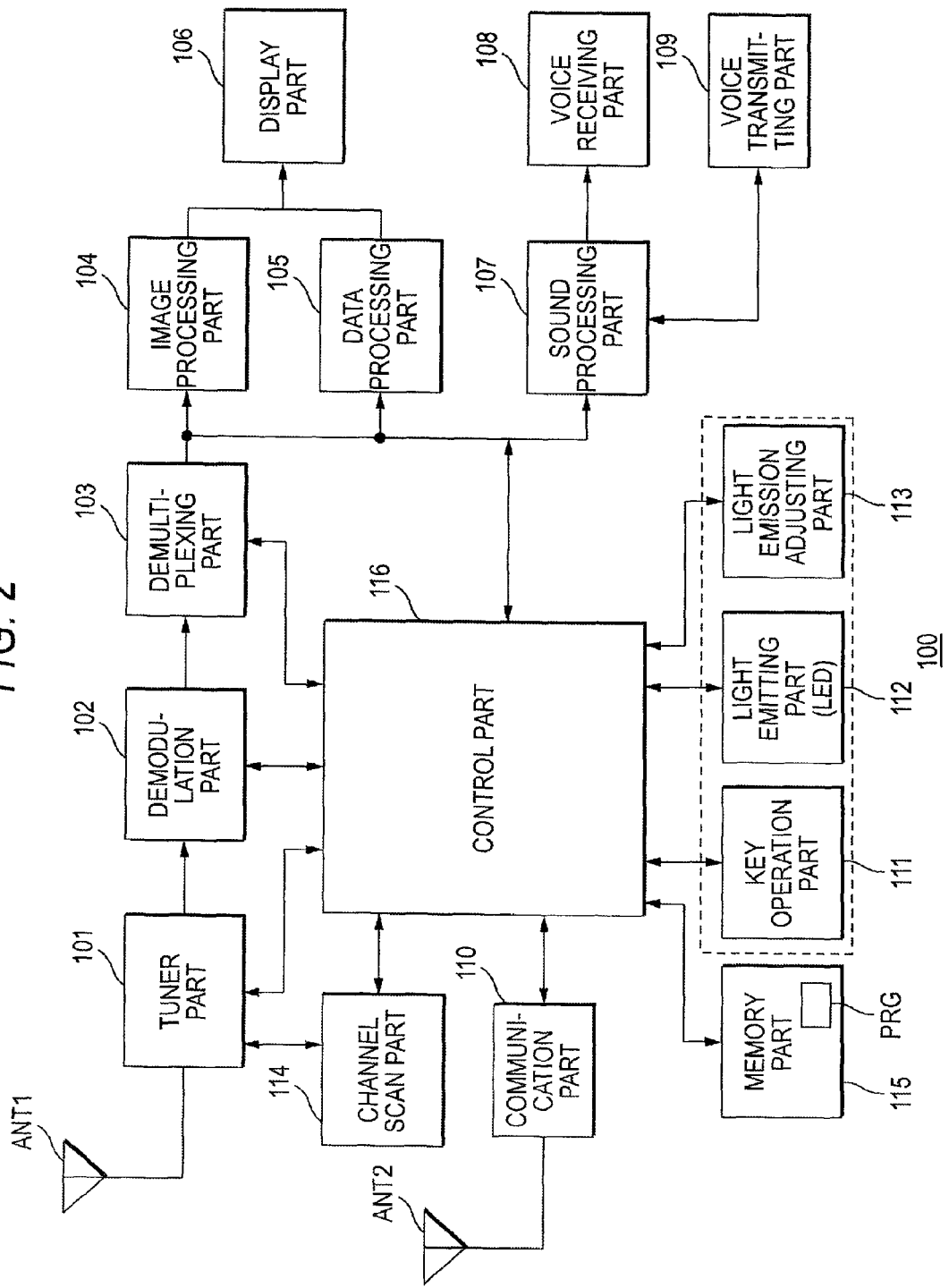
FIG. 2 is a functional block diagram showing one embodiment of a mobile telephone according to the invention.

FIG. 2 is a functional block diagram showing one embodiment of the mobile telephone according to the invention.

The mobile telephone 100 has a tuner part 101, a demodulation part 102, a demultiplexing part 103, an image processing part 104, a data processing part 105, a display part 106, a sound processing part 107, a voice receiving part 108, a voice transmitting part 109, a communication part 110, a key operation part 111, a light emitting part 112, a light emission adjusting part 113, a channel scan part 114, memory 115 and a control part 116 as shown in, for example, FIG. 2.

The tuner part 101 and the demodulation part 102 correspond to one specific example of the receiver according to the invention.

The display part 106 corresponds to one example of the display portion according to the invention, and the key operation part 111 corresponds to one example of a channel selection button according to the invention, and the control part 116 corresponds to one example of the control portion according to the invention.

The tuner part 101 is constructed of, for example, a high-frequency circuit, a tuning circuit, a frequency conversion circuit, etc., and under the control of the control part 116, broadcast waves of a specified channel (frequency) are received through an antenna ANT1 and are converted into an intermediate frequency signal and the signal is outputted to the demodulation part 102.

The demodulation part 102 is constructed of, for example, a demodulation circuit. Under the control of the control part 116, predefined demodulation processing is performed with respect to a signal outputted from the tuner part 101 and the signal is outputted to the demultiplexing part 103.

The demultiplexing part 103 performs predefined decoding processing, etc., with respect to a signal outputted from the demodulation part 102, generates an image signal, a sound signal, a data signal, etc., and outputs the signals to the image processing part 104, the data processing part 105, the sound processing part 107, the control part 116, etc.

The image processing part 104 performs predetermined image processing with respect to an image signal outputted from the demultiplexing part 103 and displays a predetermined image on the display part 106 under the control of, for example, the control part 116.

The data processing part 105 performs predetermined data processing with respect to a data signal outputted from the demultiplexing part 103 and performs predetermined display on the display part 106 under the control of, for example, the control part 116.

The display part 106 is constructed of, for example, a display device such as an LCD (Liquid crystal display), a TFT (Thin Film Transistor) type LCD or a display unit, and performs display in response to an image signal or data under the control of the control part 116.

An apparatus body 1 of the mobile telephone 100 has a first casing part 11 and a second casing part 12 as shown in, for example, FIG. 1. The first casing part 11 is foldably connected to the second casing part 12 by a folding part 13.

The display part 106 is disposed in the center of the first casing part 11 of the apparatus body 1 as shown in, for example, FIG. 1.

The sound processing part 107 performs predetermined processing with respect to a signal outputted from the demultiplexing part 103 or the communication part 110 and outputs a sound signal to the voice receiving part 108 under the control of, for example, the control part 116.

Also, the sound processing part 107 performs predetermined processing with respect to a sound signal outputted from the voice transmitting part 109 and outputs the sound signal to the control part 116 or the communication part 110 under the control of the control part 116.

The voice receiving part 108 is constructed of, for example, a sound production device such as a speaker, and performs sound production in response to a sound signal from the sound processing part 107.

The voice receiving part 108 is disposed in an upper portion of the first casing part 11 as shown in, for example, FIG. 1.

The voice transmitting part 109 outputs an electrical signal in response to the voice of, for example, a user to the sound processing part 107 or the communication part 110.

The voice transmitting part 109 is disposed in a lower portion of the second casing part 12 as shown in, for example, FIG. 1.

The communication part 110 communicates with another digital broadcast receiving apparatus having a communication function or a base station through a wireless signal under the control of, for example, the control part 116. The communication part 110 is constructed of, for example, a wireless reception part, a demodulation part, a decoding part, a digital-to-analog (D/A) conversion part, an analog-to-digital (A/D) conversion part, an encoding part, a modulation part and a wireless transmission part.

The communication part 110 converts a sound signal outputted from the voice transmitting part 109 into a wireless signal by a predefined method and outputs the signal to, for example, a base station through an antenna ANT2.

Also, the communication part 110 performs demodulation of a wireless signal received by the antenna ANT2 by a predefined method, and generates a sound signal, an image signal, a data signal, etc., and outputs the signals to the control part 116, the display part 106, the voice receiving part 108, etc.

The key operation part 111 outputs a signal in response to an operation of, for example, a user, to the control part 116.

The key operation part 111 is disposed in the center of the second casing part 12 of the apparatus body 1 as shown in, for example, FIG. 1.

For example, in the present embodiment, the key operation part 111 has numeric buttons such as "1", "2", . . . , "9", "0", a "*" button, a "#" button, a directional button AB, a scan button SB, a lighting button RB, etc.

The key operation part 111 functions as a button for inputting telephone number assigned to a communication device of a communication destination when, for example, in a telephone mode.

Also, a part or all buttons of the plural buttons in the key operation part 111 function as plural channel selection buttons corresponding to channels, when, for example, in a digital broadcast receiving mode.

In the present embodiment, for example, of the buttons of the key operation part 111, the "1" to "9" buttons respectively function as respective channel selection buttons of channels 1 to 9, the "*" button functions as a channel selection button of channel 10, the "0" button functions as a music selection button of channel 11, the "#" button functions as a channel selection button of channel 12, and the channel selection buttons corresponding to these channels are called buttons B.

The light emitting parts 112 are disposed in correspondence with, for example, each of the plural channel selection buttons of the key operation part 111 and emit light under the control of the control part 116, and thereby illuminate the key operation part 111 including the channel selection buttons B.

For example, the light emitting part 112 is constructed of a light emitting device such as an LED (Light emitting diode) or an organic EL (electroluminescence) device.

Also, plural LEDs for emitting light by plural different colors may be disposed as the light emitting part 112.

The light emission adjusting part 113 changes light emission intensity of the light emitting part 112 by controlling the amount of electric current supplied to the light emitting part 112 under the control of, for example, the control part 116.

The light emission adjusting part 113 makes the light emitting part 112 emit light at a light emission intensity that corresponds to a reception state under the control of, for example, the control part 116.

Also, the light emission adjusting part 113 makes the light emitting part 112 emit light in a color that corresponds to a reception state under the control of the control part 116.

The channel scan part 114 controls a tuning circuit, etc., of the tuner part 101 and scans a receivable channel under the control of, for example, the control part 116.

The memory 115 records user data, data such as channel information, a program (PRG), etc., and functions as work space of the processing of the control part 116 under the control of the control part 116.

The memory 115 is comprised of, for example, ROM (Read only memory) or RAM (Random Access Memory).

The program (PRG) has, for example, a function according to the invention and the control part 116 implements the function according to the invention by execution.

The control part 116 performs centralized control of the entire apparatus.

For example, the control part 116 performs the control by executing the program (PRG) using the memory 115 as a workspace as described above. Description will be made below with a focus on functions according to the invention.

The control part 116 performs control so as to be able to visually distinguish a channel selection button B corresponding to a channel capable of being received by the tuner part 101 from the other channel selection buttons B among the plural channel selection buttons B.

Specifically, the control part 116 performs control so as to be able to visually distinguish a channel selection button B corresponding to a receivable channel from the other channel selection buttons B by emitting light of the light emitting part 112 and thereby illuminating the channel selection button B corresponding to the channel capable of being received by the tuner part 101.

Also, the control part 116 performs control so as to be able to visually distinguish a channel selection button B corresponding to a channel displayed on the display part 106 from other channel selection buttons B, among the channel selection buttons B corresponding to the channels capable of being received by the tuner part 101.

Specifically, the control part 116 performs the control visually distinguishably by, for example, blinking a channel selection button B corresponding to a channel displayed on the display part 106 among the channel selection buttons B corresponding to receivable channels, and lighting up the other channel selection buttons B. Also, the distinction may be made by color.

Also, the control part 116 makes the light emitting part 112 corresponding to the channel emit light at light emission intensity that corresponds to a reception state of broadcast waves of each of the channels by the tuner part 101.

Specifically, the control part 116 makes the light emission adjusting part 113 control the amount of electric current supplied to the light emitting part 112 in response to a reception state.

For example, the amount of electric current is controlled so that light emission intensity of the light emitting part 112 increases for a good reception state and the light emission intensity decreases for a bad reception state.

Also, the control part 116 may make the light emitting part 112 emit light of a color corresponding to a reception state of broadcast waves of each of the channels by the tuner part 101.

Specifically, the control part 116 makes, for example, the light emitting part 112 corresponding to a channel selection button B of a channel with a good reception state emit blue light, and makes the light emitting part 112 corresponding to a channel selection button B of a channel with a bad reception state emit red light. Also, the distinction may be made by lighting or blinking.

Also, when the control part 116 makes the channel scan part 114 execute a channel scan for detecting a channel capable of being received by the tuner part 101, the control part 116 makes the light emitting part 112 emit light and makes the display part 106 perform display for associating the channel capable of being received by the tuner part 101 with a broadcast station of its channel.

That is, as described above, in the case of lighting up the light emitting parts 112 disposed in the channel selection buttons B corresponding to all the channels broadcast in the reception area (for the sake of simplicity, this is also called "lighting up the channel selection buttons B"), there are cases where a channel incapable of being viewed exists due to influence of a failure peculiar to the place in which a channel scan is executed even though it is lit up.

In such cases, the control part 116 effectively changes color of a lit LED (for example, a channel with a good reception state lights up blue and a channel with a bad reception state lights up red) or stepwise varies light emission intensity of lighting in response to a reception state as described above (for example, a channel with a good reception state emits light strongly and a channel with a bad reception state emits light weakly).

As a result of this, a user can distinguish a channel which is not broadcast from a channel which is broadcast but cannot be viewed due to a bad reception state.

In addition, the reception state described herein includes a concept reproduction quality including video/sound or electric field intensity of radio wave reception.

One specific example of an operation of the mobile telephone 100 will be described below.

Figure 3:
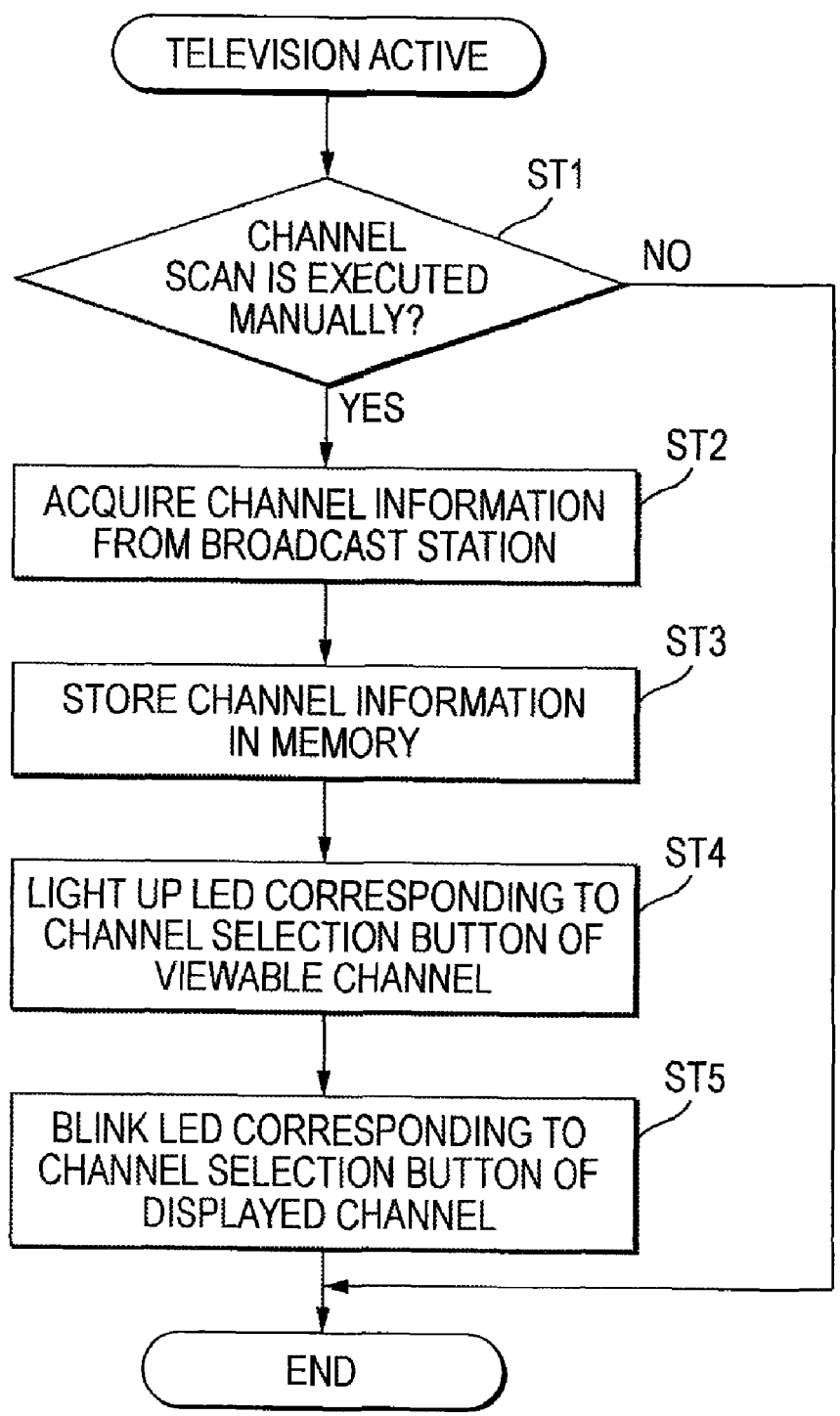
FIG. 3 is a flowchart describing an operation at the time of a channel scan of the mobile telephone shown in FIG. 1.

FIG. 3 is a flowchart describing an operation at the time of a channel scan of the mobile telephone shown in FIG. 1.

An operation of the case of starting a channel scan operation manually will be described with a focus on an operation of the control part 116 with reference to FIG. 3.

The control part 116 assigns a channel scan function to a particular key (for example, a scan button SB) among plural buttons of the key operation part 111 at the time of, for example, a viewing mode.

When the scan button SB of the key operation part 111 is operated in step ST1, the control part 116 acquires channel information from a broadcast station within the reception area and generates the channel information in step ST2. Otherwise, the processing is ended.

In step ST3, the control part 116 stores the acquired channel information into the memory 115. The channel information includes, for example, a channel capable of being viewed in the acquired area and a button number corresponding to the channel (for example, A television and 1).

Specifically, in step ST4, the control part 116 performs control visually distinguishably by making the light emitting parts (LEDs) 112 disposed in correspondence with plural channel selection buttons B corresponding to viewable (receivable) channels light up and suppressing light emissions of the light emitting parts 112 disposed in correspondence with the other channel selection buttons B.

In step ST5, the control part 116 makes LED of the button of channel selection button B corresponding to the channel displayed on the display part 106 blink.

Also, another embodiment in which channel information is acquired and also a reception state in its position is considered will be shown below.

FIG. 4 is a diagram showing one specific example of channel information that corresponds to a channel scan result of the mobile telephone shown in FIG. 1.

The control part 116 generates channel information DC based on a channel scan result as shown in, for example, FIG. 4. The channel information DC is recorded with, for example, a channel and the reception state of broadcast waves of its channel being associated with each other. For simple description, the case where a reception state is good is represented as a circle mark, and the case where a reception state is not good is represented as a triangle mark, and the case where reception cannot be performed is represented as a cross (X) mark.

In step ST3, the control part 116 stores the channel information DC into the memory 115.

In step ST4, the control part 116 performs control so as to be able to visually distinguish a channel selection button B corresponding to a channel capable of being received by the tuner part 101 from the other channel selection buttons B among the plural channel selection buttons B, based on the channel information DC indicating the channel scan result.

Specifically, the control part 116 performs control so as to be able to visually distinguish, by lighting up the light emitting parts (LEDs) 112 disposed in correspondence with plural channel selection buttons B corresponding to viewable (receivable) channels and suppressing light emissions of the light emitting parts 112 disposed in correspondence with the other channel selection buttons B.

In step ST5, the control part 116 makes the LED of the button of channel selection button B corresponding to the channel displayed on the display part 106 blink.

Specifically, in step ST5, the control part 116 makes the tuner part 101 receive broadcast waves of a channel with the smallest number, for example, among the viewable channel numbers within a reception area in the present place based on a scan result, and makes the display part 106 display an image in response to contents data included in the broadcast waves of this channel, and blinks the light emitting part 112 disposed in a channel selection button B corresponding to this channel.

In addition, the present specific example assumes that the viewable channel is a channel actually received by a channel scan, but the control part 116 may recognize an area code from a broadcast station received by the tuner part 101 and light up channel selection buttons B corresponding to all the channels broadcast in the reception area.

Figure 5:
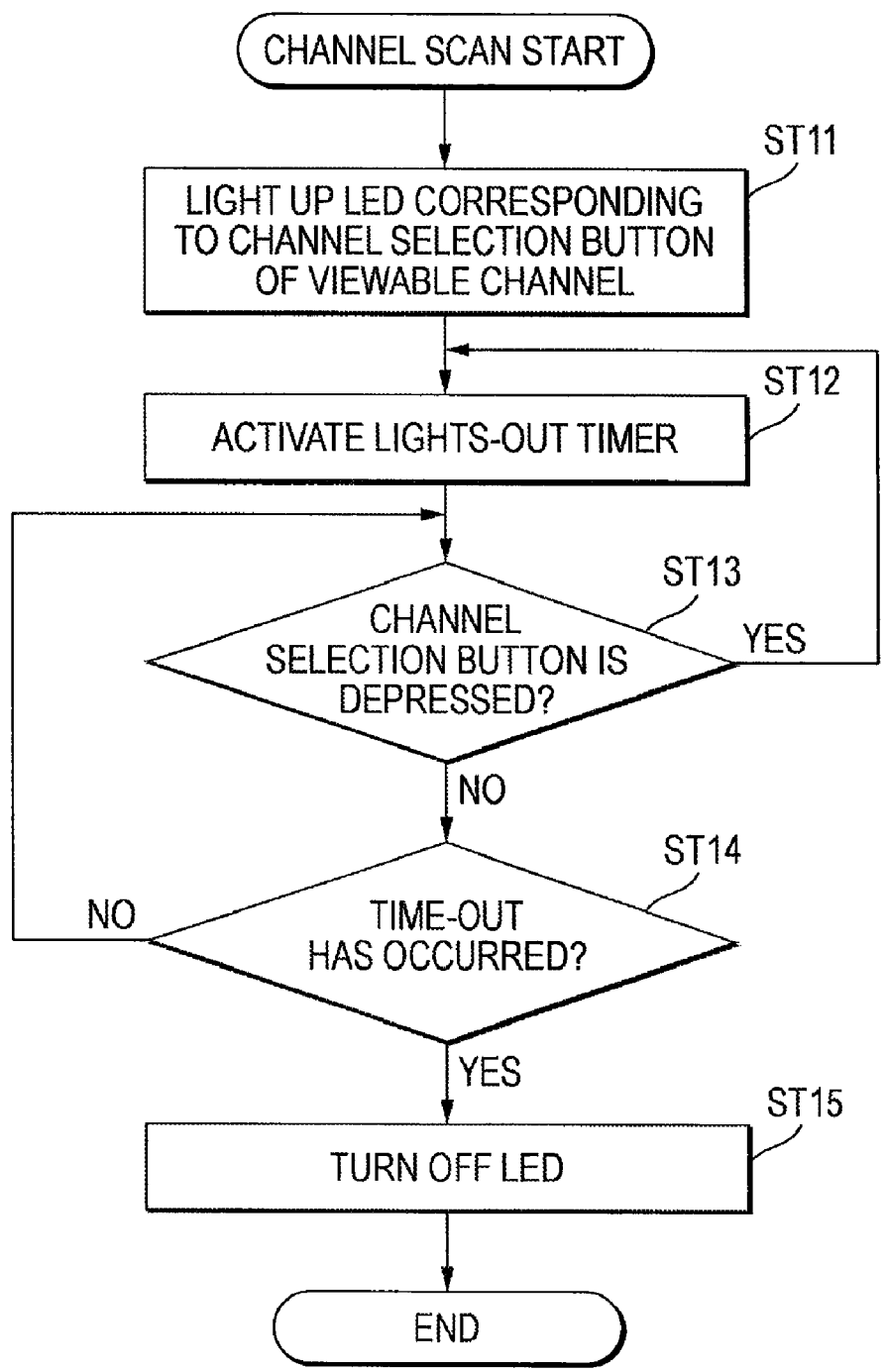
FIG. 5 is a flowchart describing an operation when turning off a light emitting part (LED) of the mobile telephone shown in FIG. 1.

FIG. 5 is a flowchart describing an operation at the time of turning off a light emitting part (LED) of the mobile telephone shown in FIG. 1.

An operation of automatically turning off the light emitting part (LED) 112 will be described with a focus on an operation of the control part 116 with reference to FIG. 5.

In step ST11, the control part 116 causes the light emitting part (LED) 112 corresponding to a channel selection button B of a receivable channel based on channel information DC to light up.

In step ST12, using lighting of the LED 112 as a trigger, the control part 116 activates a lights-out timer which is a timer for measuring time for turning off the LED 112 after a lapse of a predetermined time from the start of its lighting.

In step ST13, the control part 116 determines whether or not a channel selection button B is operated. When the control part 116 decides that the channel selection button B is operated, the flowchart returns to processing of step ST12 and the previous elapsed time of the lights-out timer is reset and timing is startedanew.

On the other hand, when the channel selection button B is determined to have been not operated in step ST13, the control part 116 determines whether or not a time-out has occurred. Specifically, the control part 116 determines whether or not a predetermined time, for example, several seconds have elapsed (ST14).

When it is determined that the time-out has not occurred in step ST14, the flowchart returns to processing of step ST13. When it is determined that the time-out has occurred, that is, the predetermined time has elapsed, light emission of the light emitting part (LED) 112 is suppressed (turned off).

Power consumption can be reduced by turning off the light emitting part (LED) 112 after a lapse of the predetermined time as described above.

Also, when the channel selection button continues to be operated repeatedly within a predetermined time, the light emitting part (LED) 112 continues to light up, so that, for example, even when a user wavers in channel selection, the light emitting part (LED) 112 continues to light up without turning off during channel selection.

Figure 6:
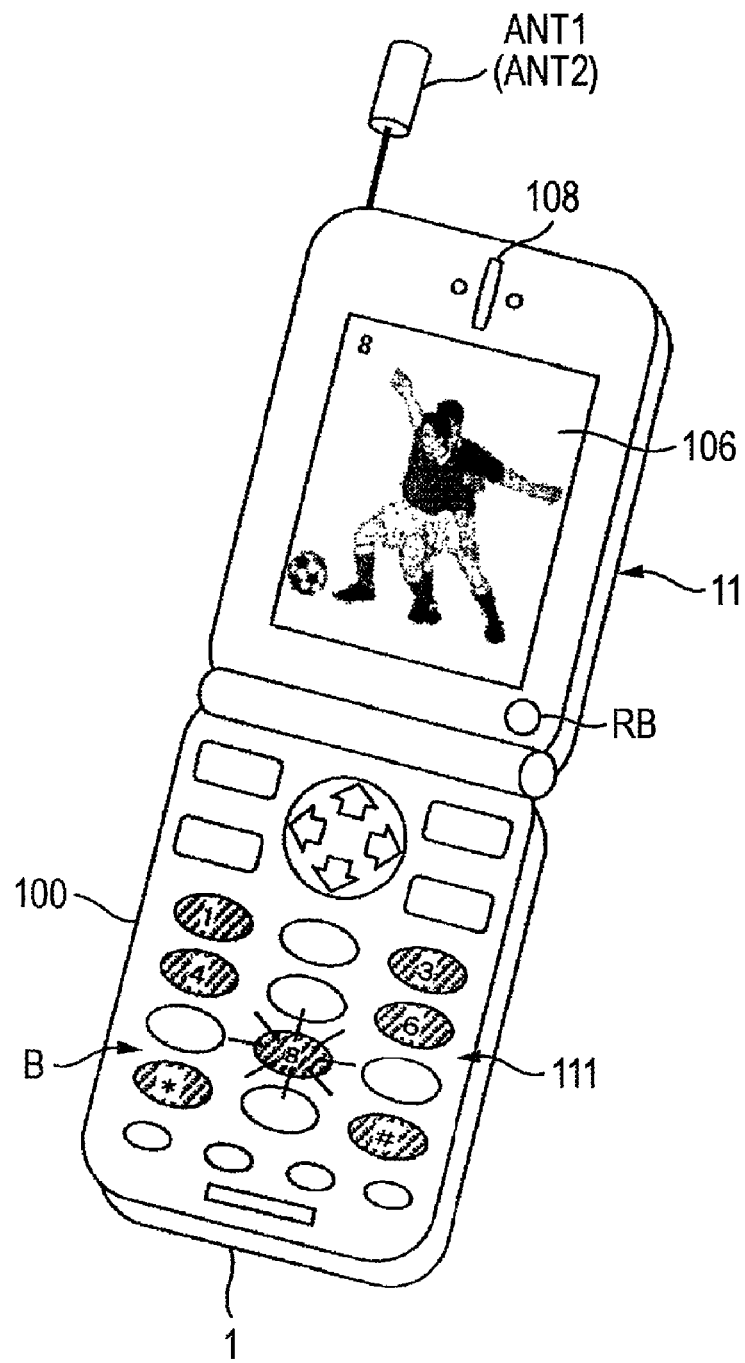
FIG. 6 is a diagram describing turning on and turning off operations of LEDs of channel selection buttons B of the mobile telephone shown in FIG. 1.

FIG. 6 is a diagram describing lighting and turning off operations of LEDs of channel selection buttons B of the mobile telephone shown in FIG. 1.

Next, a method for lighting up LEDs of channel selection buttons B as necessary when the light emitting part (LED) 112 have been turned off will be described with reference to FIG. 6.

This is a function that assumes, for example, the case where a user wants to know a viewed channel during viewing of television or the ease where a user wants to change a channel.

As shown in FIG. 6, in the key operation part 111, a lighting button RB for controlling lighting and turning off of the light emitting part (LED) 112 is disposed in, for example, a lower right portion of the first casing part 11 of the apparatus 1.

For example, when the lighting button RB is operated at the time of turning off the light emitting part (LED) 112, the control part 116 makes the light emitting part 112 corresponding to a viewable channel light up and makes the light emitting part 112 corresponding to a channel viewed at present blink, based on channel information DC indicating a result of the previous channel scan recorded in the memory 115.

In the present specific example, the "8" button is illuminated so as to be blinked by making the display part 106 display a viewable channel 8 and blinking the light emitting part 112 corresponding to this channel.

Even when a channel scan is again executed manually, the same state can be obtained, but by recording the previous channel information DC inside the memory 115, the LED can be lit up in a short time without the need for receiving and sending to and from a broadcast station for a channel scan again.

Figure 7:
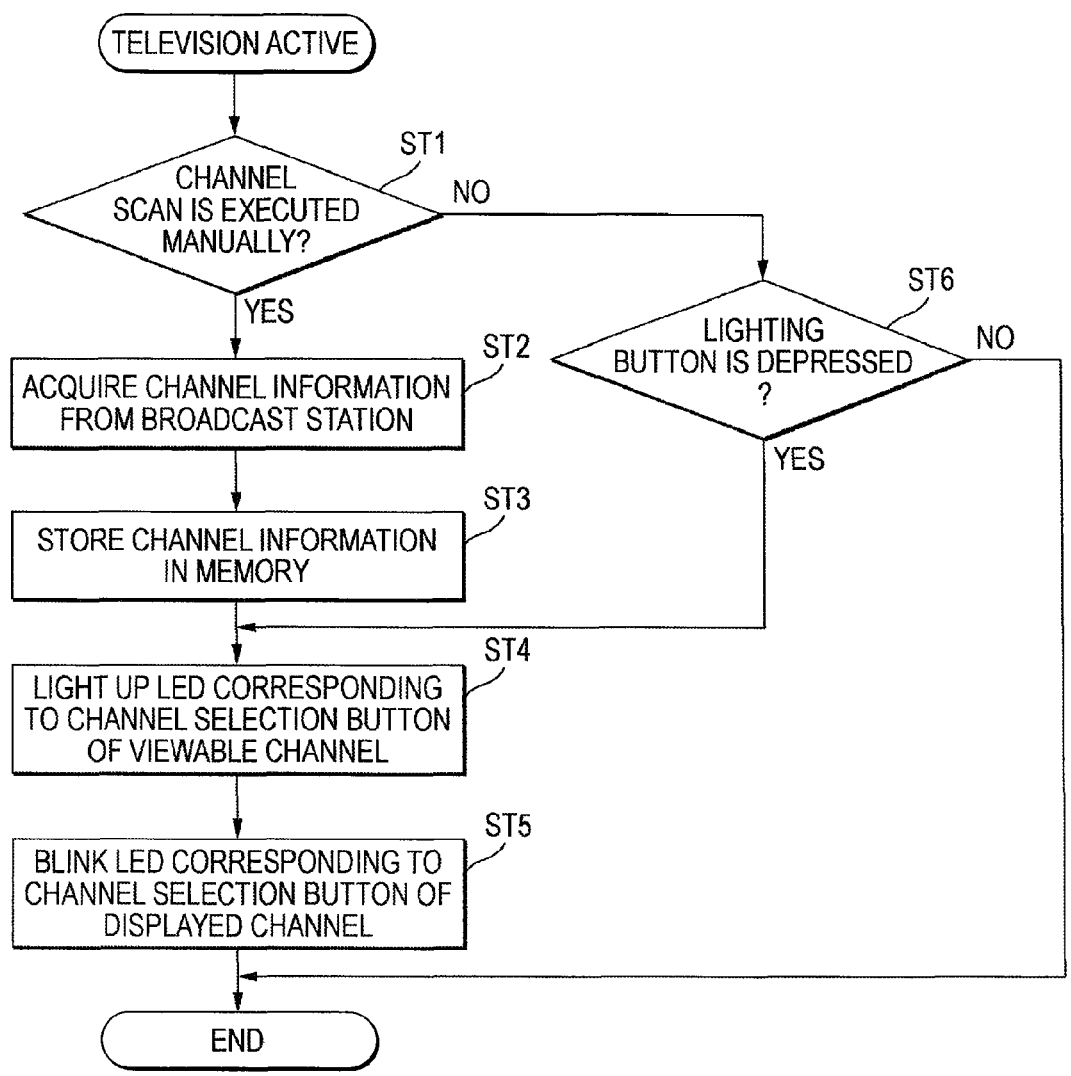
FIG. 7 is a flowchart describing an operation of turning on an LED of a channel selection button during lights-out of an LED of the mobile telephone shown in FIG. 1.

FIG. 7 is a flowchart describing an operation of the case of again lighting up an LED of a channel selection button when an LED of the mobile telephone has been turned off shown in FIG. 1.

First and second methods for again lighting up an LED at the time of lights-out will be described.

The first method is a flow of performing a channel scan manually and a method for again acquiring channel information based on a reception state of broadcast waves from a broadcast station as shown in, for example, FIG. 3.

The second method is a method for reading out channel information DC already recorded in the memory 115 by depressing the lighting button RB without performing a channel scan, and lighting up the light emitting part (LED) 112 based on this channel information DC as shown in, for example, FIG. 7.

Only a difference from the operation shown in FIG. 3 will be described.

Specifically, when the control part 116 determines that a channel scan is not performed manually in step ST1, that is, a scan button SB of the key operation part 111 is not operated, it determines whether or not the lighting button RB is operated (ST6).

When it is determined that the lighting button RB is operated in the determination of step ST6, the flowchart proceeds to processing of step ST4 and channel information DC already recorded in the memory 115 is read out and the light emitting part (LED) 112 is lit up based on this channel information DC.

On the other hand, when it is determined that the lighting button RB is not operated in the determination of step ST6, the series of processing is ended.

For example, as an actual operation method, the processing in response to an operation of the lighting button RB as shown in the second method is preferable from the standpoint of operability.

Also, the configuration may be such that the lighting button RB is not disposed separately.

For example, the control part 116 may light up the light emitting part (LED) 112 based on the channel information DC using any of the button operations of the key operation part 111 as a trigger.

A change procedure of a channel of the case of this configuration will be described.

When any of the channel selection buttons B among the key operation part 111 is operated (first time), the LEDs 112 are lit up, and when any of the lit channel selection buttons B among the LEDs is operated (second time), the channel is decided to a channel corresponding to this channel selection button B (two-stage operation).

Also, the channel selection buttons B are further effective in prioritizing a change in a channel and using the other key operation parts for the purpose of LED lighting. That is, it is similar to "*", "0", "#" buttons as well as numeric keys.

Figure 8:
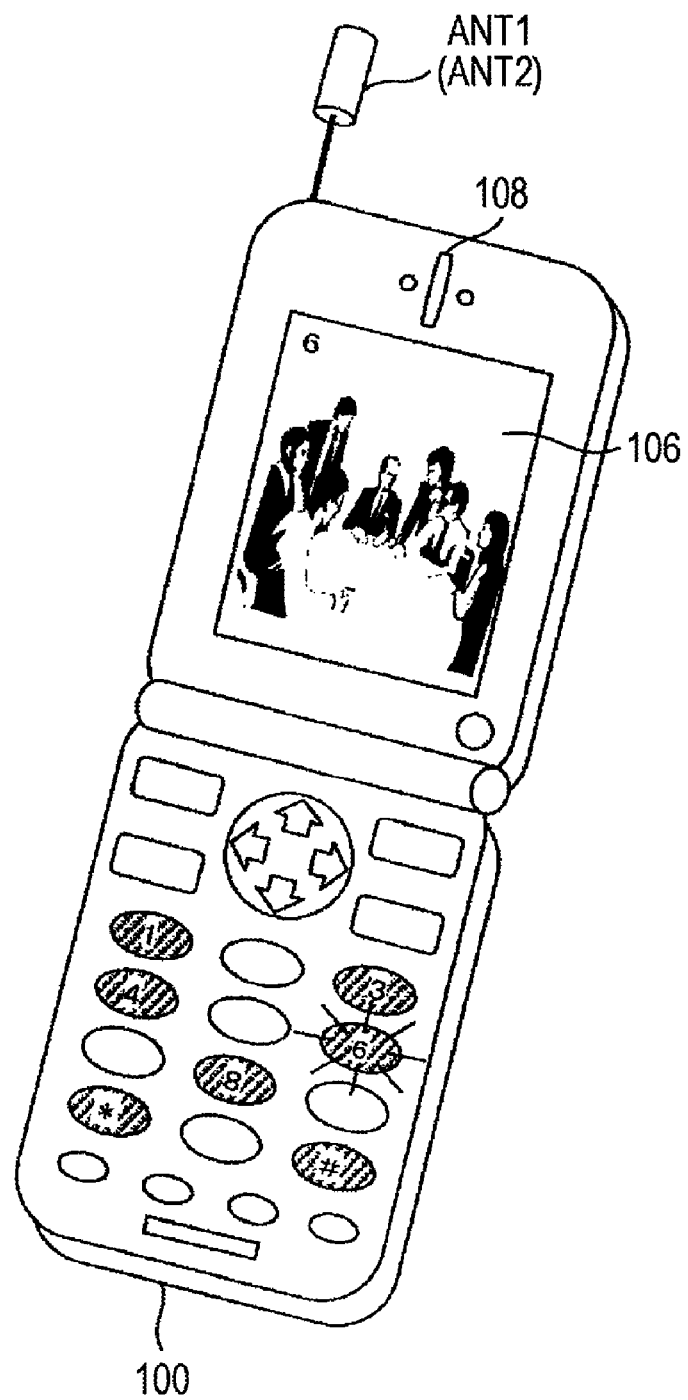
FIG. 8 is a diagram describing one specific example of an operation when receiving digital broadcast waves shown in FIG. 1.

FIG. 8 is a diagram describing one specific example of an operation at the time of receiving digital broadcast waves shown in FIG. 1.

For example, the control part 116 according to the present embodiment lights up channel selection buttons B at the time of starting to receive digital broadcast waves.

Specifically, the control part 116 records a channel at the time of the previous end in the memory 115.

At the time of activating a digital broadcast receiving function, based on information indicating a channel at the time of the previous end recorded in the memory 115, the control part 116 makes the tuner part 101 receive broadcast waves of this channel and makes the display part 106 display an image in response to contents data included in the broadcast waves.

Also, at the same time, the control part 116 lights up a viewable channel and blinks a displayed channel in a manner similar to the above based on channel information DC recorded in the memory 115.

Thus, even when a user performs another operation (for example), during viewing, a broadcast of the previous channel can be viewed without performing troublesome operation by again activating the digital broadcast receiving function.

Also, a receivable channel selection button B is lit up based on channel information DC recorded in the memory 115, so that notification of a receivable channel can be provided without performing a scan again.

As described above, the mobile telephone 100 according to the present embodiment is provided with the tuner part 101 for receiving broadcast waves of a channel specified, the key operation part 111 including plural channel selection buttons B corresponding to channels, and the control part 116 for performing control so as to be able to visually distinguish a channel selection button B corresponding to a channel capable of being received by the tuner part 101 from the other channel selection buttons B among the plural channel selection buttons B, so that notification of a receivable channel can be provided surely.

Also, the light emitting part (LED) 112 disposed in correspondence with a channel selection button B is disposed, and the control part 116 makes the light emitting part (LED) 112 light up and illuminates a channel selection button B corresponding to a channel capable of being received by the tuner part 101, so that a user can be notified of a receivable channel more surely.

Also, the control part 116 performs control so as to be able to visually distinguish a channel selection button B corresponding to a channel displayed on the display part 106 from the other channel selection buttons B, among the plural channel selection buttons B corresponding to channels capable of being received by the tuner part 101.

Control is performed distinguishably by, for example, blinking and lighting, or blue and red, so that a user can surely be notified of a channel displayed on the display part 106.

That is, notification of a channel selection button B of a receivable channel is provided by light emission or illumination, so that it is easy for a user to select a channel.

Also, notification of a receivable channel is provided by light emission or illumination of the key operation part 111 without displaying an image about the receivable channel on the display part 106, so that processing of the display of the display part 106 can be reduced.

Also, the control part 116 makes the light emitting part (LED) 112 corresponding to a channel emit light at light emission intensity corresponding to a reception state of broadcast waves of each of the channels by the tuner part 101 or causes light emission by color that correspond to a reception state, and thereby notification reflecting the reception state can be provided.

For example, while checking light emission or illumination of a channel selection button B, a user can search an environment (a place, a position or a direction of a terminal) with a good reception state.

Also, a user can find channels with a good reception state and can intentionally select the channel with a good reception state.

Figure 9:
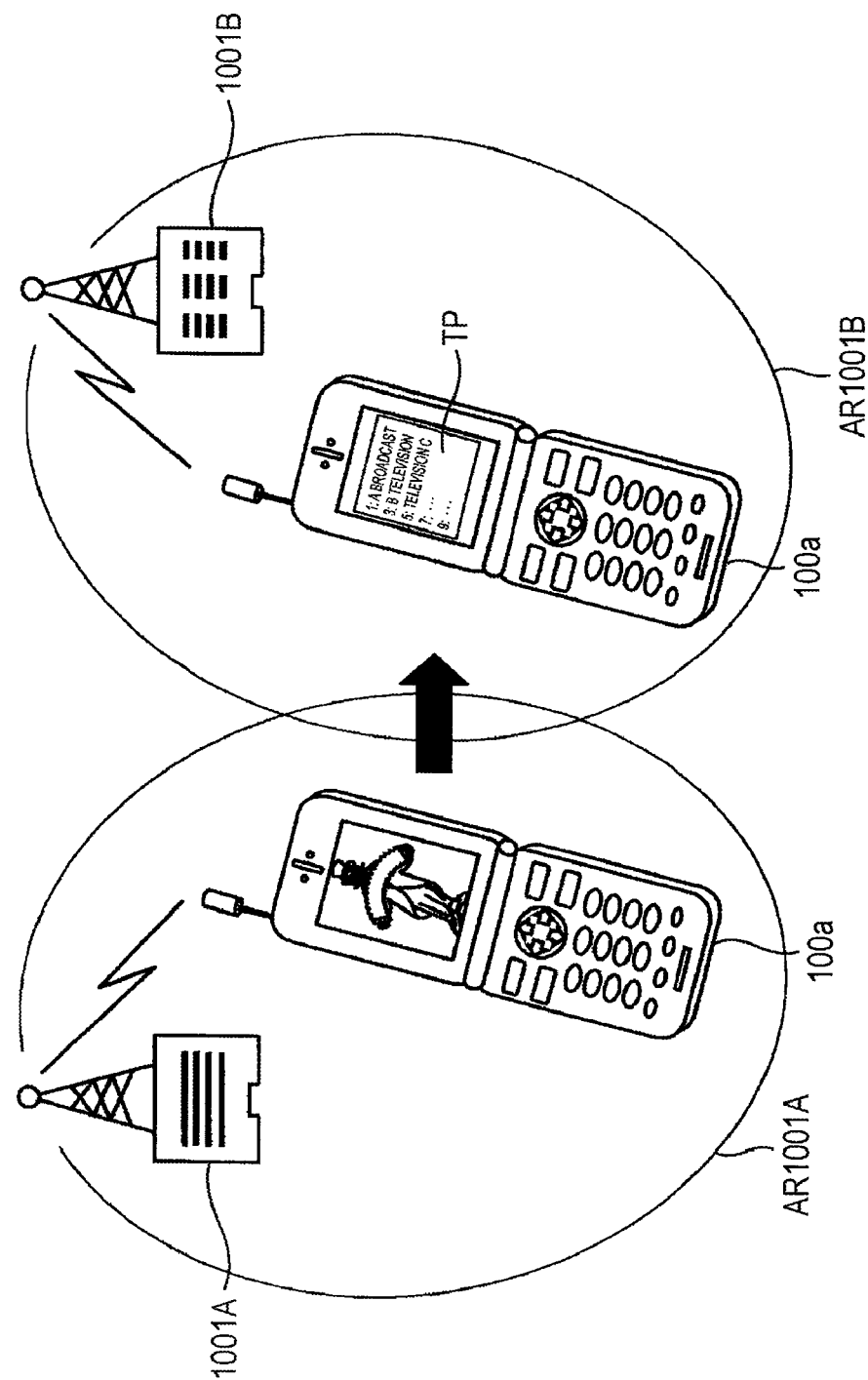
FIG. 9 is a diagram describing an operation when the mobile telephone is moving according to a second embodiment of the invention.

FIG. 9 is a diagram describing an operation at the time of movement of a mobile telephone according to a second embodiment of the invention.

Next, an operation at the time of movement which is a feature of a digital broadcast receiving apparatus for mobile unit, particularly, a channel scan will be described with reference to FIG. 9.

A problem does not arise particularly in the case of moving within the same reception area, but the following description assumes moving to change a reception area while a digital broadcast is viewed by a mobile telephone as shown in, for example, FIG. 9.

The mobile telephone moves from a reception area AR1001A of a broadcast station 1001A to a reception area AR1001B of another broadcast station 1001B as shown in, for example, FIG. 9. Therefore, digital broadcast waves sent from the broadcast station 1001A that are received in the reception area AR1001A can no longer be received.

A mobile telephone 100a according to the present embodiment has an area detection part for determining a broadcast station of an information sending source. When this area detection part detects a change in a broadcast station, a channel scan is executed automatically.

Description will be made below with reference to the drawings.

Figure 10:
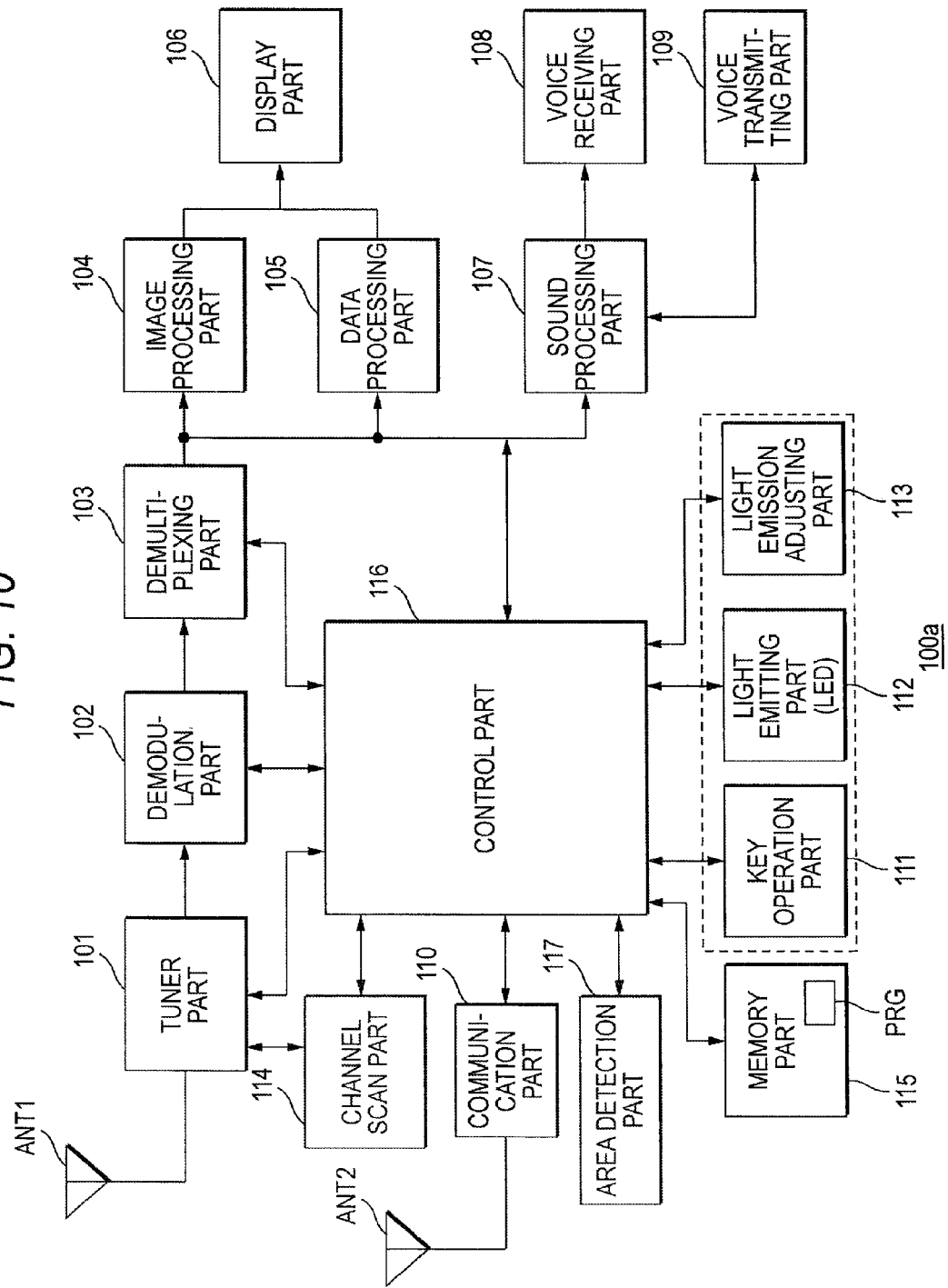
FIG. 10 is a functional block diagram of the mobile telephone according to the second embodiment of the invention.

FIG. 10 is a functional block diagram of the mobile telephone according to the second embodiment of the invention.

The mobile telephone 100a according to the present embodiment has a tuner part 101, a demodulation part 102, a demultiplexing part 103, an image processing part 104, a data processing part 105, a display part 106, a sound processing part 107, a voice receiving part 108, a voice transmitting part 109, a communication part 110, a key operation part 111, a light emitting part 112, a light emission adjusting part 113, a channel scan part 114, a memory 115, a control part 116 and an area detection part 117 as shown in, for example, FIG. 10.

A difference between the mobile telephone 100a and the mobile telephone 100 according to the first embodiment is that the area detection part 117 is additionally provided.

Only the difference from the first embodiment will be described. The same numerals are attached to the other components and their descriptions are omitted.

The area detection part 117 detects a change in a reception area and outputs a signal indicating a detection result to the control part 116.

Specifically, the area detection part 117 determines a reception area based on, for example, receiving area information or receiving intensity, etc., of broadcast waves sent from a broadcast station of an information sending source.

When the area detection part 117 detects a change in this reception area, for example, a change in the broadcast station, the control part 116 makes the channel scan part 114 perform a channel scan and makes the light emitting part (LED) 112 of a channel selection button B corresponding to a channel capable of being received by the tuner part 101 light up.

Or, the control part 116 acquires channel information and makes the light emitting part 112 corresponding to a channel selection button B of a receivable channel light up.

Also, the control part 116 makes the display part 106 perform display of a channel capable of being received by the tuner part 101 and information about a broadcast station of the channel being associated with each other, when a channel scan is executed.

Specifically, the control part 116 makes the display part 106 display a list TP of television stations and channels assigned to broadcast stations of a moving destination.

In the present embodiment, the list TP is displayed after an automatic channel scan, and this is because a television station offering a program as well as a channel number may want to be checked in a new place.

Of course, a reception state of each channel can also be displayed in this list TP as information.

Also, the control part 116 may display a program of, for example, the smallest number in the viewable channels, on the display part 106 in a manner similar to the first embodiment.

Further, in order to take advantage of movement as a portable terminal, the control part 116 may always control light emission color or light emission intensity of the light emitting part (LED) 112 in response to a reception state while updating a reception state by the tuner part 101.

Thus, notification of a receivable channel can always be provided.

Figure 11:
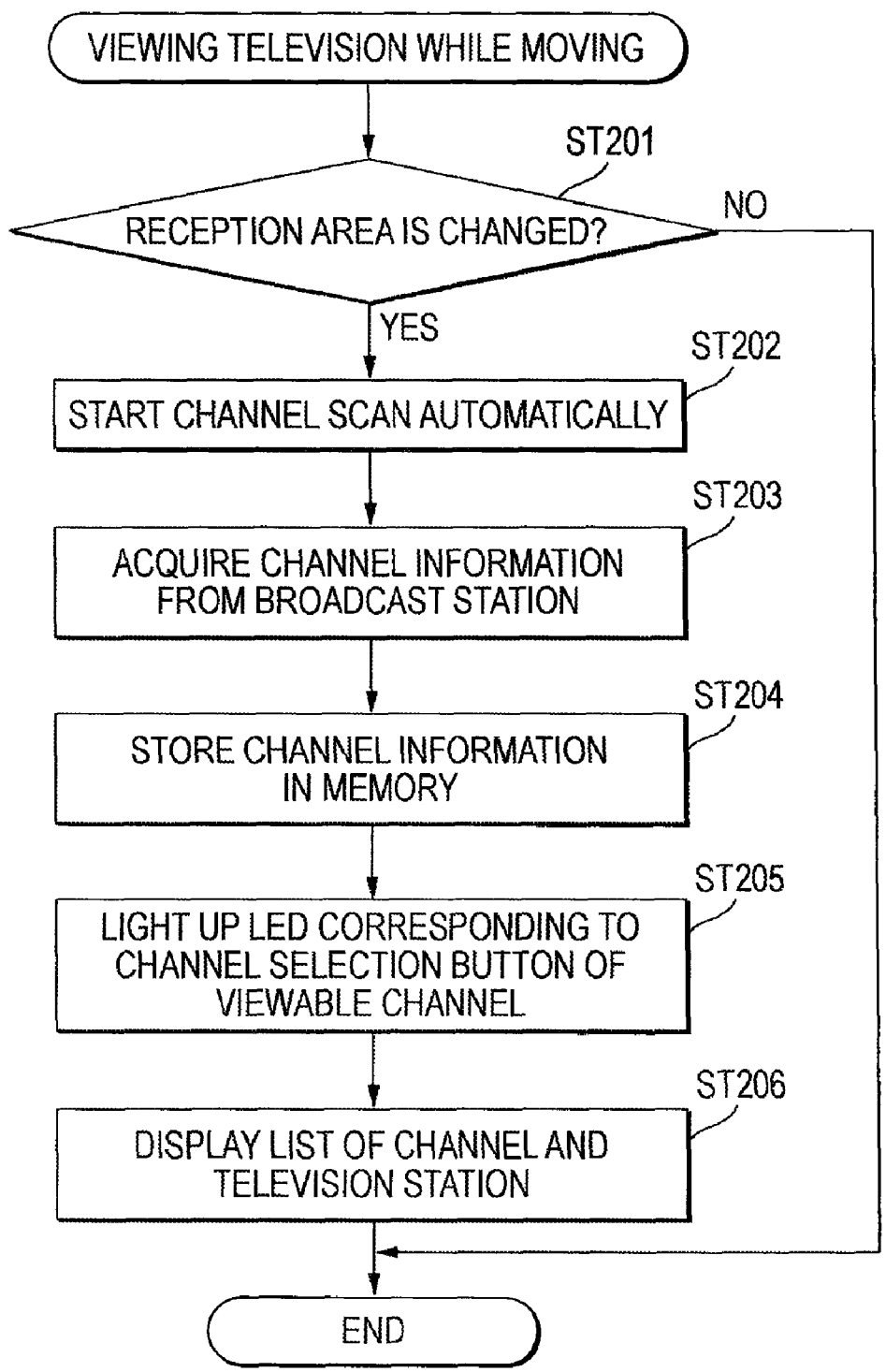
FIG. 11 is a flowchart describing an operation when the mobile telephone shown in FIG. 10 is moving.

FIG. 11 is a flowchart describing an operation at the time of movement of the mobile telephone shown in FIG. 10.

An operation of the case where the mobile telephone moves at the time of, for example, television viewing will be described with a focus on an operation of the control part 116 with reference to FIG. 11.

In step ST201, the control part 116 determines whether or not the area detection part 117 detects a change in a reception area.

When it is determined that the reception area is not changed, the control part 116 performs normal processing.

On the other hand, when the area detection part 117 detects the change in the receiving area in step ST201, the channel scan part 114 is made to execute a channel scan automatically (ST202) and channel information DC is generated based on receiving intensity of broadcast waves from a broadcast station within the reception area (ST203).

In step ST204, the control part 116 records the channel information DC in the memory 115.

In step ST205, the control part 116 performs control so as to visually distinguish, by making the light emitting parts (LEDs) 112 disposed in correspondence with plural channel selection buttons B corresponding to viewable (receivable) channels light up and suppressing light emissions of the light emitting parts 112 disposed in correspondence with the other channel selection buttons B among the plural channel selection buttons B, based on the channel information DC indicating a result of the channel scan.

In step ST206, the control part 116 makes the display part 106 display the channel list TP described above based on the scan result.

Since the other actions are similar to those of the first embodiment, the description is omitted.

As described above, in the present embodiment, the area detection part 117 for detecting a change in a reception area (area) is provided and the control part 116 makes the light emitting part (LED) 112 corresponding to a channel selection button B of a channel capable of being received by the tuner part 101 light up when the area detection part 117 detects the change in the reception area, so that notification of a receivable channel can be provided surely even when moving from a reception area of a broadcast station to a reception area of another broadcast station.

Also, the control part 116 makes the light emitting part (LED) 112 light up and makes the display part 106 perform display (for example, the list TP) in which a channel capable of being received by the tuner part 101 is associated with a broadcast station of the channel when the channel scan part 114 executes a channel scan for detecting the channel capable of being received by the tuner part 101, so that notification of information in which a receivable channel is associated with a broadcast station can be provided at the time of movement.

Also, for example, even in the area visited for the first time, information about receivable channels of television broadcasting or radio broadcasting can be obtained and a desired view program can be viewed.

That is, even when a reception area changes during movement, an operation and channel selection for continuous viewing are easy.

Also, by performing a channel scan automatically when a reception area changes and video is not temporarily displayable, a user can find, for example, a cause for the received picture not being displayed.

In addition, the invention is not limited to the present embodiments and preferred modifications can be made arbitrarily.

For example, a configuration of the mobile telephone 100 described above is not limited to the configuration described above.

Also, the program (PRG) may be downloaded through a communication network.

Also, the control part may be implemented by a circuit of hardware having the functions according to the invention.

INDUSTRIAL APPLICABILITY

In a digital broadcast receiving apparatus of the invention described in (1) to (7), a user can be notified of a receivable channel surely, so that industrial applicability is extremely wide as a digital broadcast receiving apparatus mounted in a mobile unit of a mobile telephone, a PDA, a car navigation apparatus, etc.

In addition, the invention is not limited to the embodiments described above.

FIG. 2
101 TUNER PART
102 DEMODULATION PART
103 DEMULTIPLEXING PART
104 IMAGE PROCESSING PART
105 DATA PROCESSING PART
106 DISPLAY PART
107 SOUND PROCESSING PART
108 VOICE RECEIVING PART
109 VOICE TRANSMITTING PART
110 COMMUNICATION PART
111 KEY OPERATION PART
112 LIGHT EMITTING PART (LED)
113 LIGHT EMISSION ADJUSTING PART
114 CHANNEL SCAN PART
115 MEMORY PART
116 CONTROL PART
FIG. 3
ST1 CHANNEL SCAN IS EXECUTED MANUALLY
ST2 ACQUIRE CHANNEL INFORMATION FROM BROADCAST STATION
ST3 STORE CHANNEL INFORMATION IN MEMORY
ST4 LIGHT UP LED CORRESPONDING TO CHANNEL SELECTION BUTTON OF VIEWABLE CHANNEL
ST5 BLINK LED CORRESPONDING TO CHANNEL SELECTION BUTTON OF DISPLAYED CHANNEL
A1 TELEVISION ACTIVE
A2 END
FIG. 4
1 TELEVISION STATION
2 RECEPTION STATE
3 A BROADCAST
4 B TELEVISION
5 TELEVISION C
6 TELEVISION D
FIG. 5
ST11 LIGHT UP LED CORRESPONDING TO CHANNEL SELECTION BUTTON OF VIEWABLE CHANNEL
ST12 ACTIVATE LIGHTS-OUT TIMER
ST13 CHANNEL SELECTION BUTTON IS DEPRESSED?
ST14 TIME-OUT HAS OCCURRED?
ST15 TURN OFF LED
A1 CHANNEL SCAN START
A2 END
FIG. 7
ST1 CHANNEL SCAN IS EXECUTED MANUALLY?
ST2 ACQUIRE CHANNEL INFORMATION FROM BROADCAST STATION
ST3 STORE CHANNEL INFORMATION IN MEMORY
ST4 LIGHT UP LED CORRESPONDING TO CHANNEL SELECTION BUTTON OF VIEWABLE CHANNEL
ST5 BLINK LED CORRESPONDING TO CHANNEL SELECTION BUTTON OF DISPLAYED CHANNEL
ST6 LIGHTING BUTTON IS DEPRESSED?
A1 TELEVISION ACTIVE
A2 END

FIG. 9
TP
1: A BROADCAST
3: B TELEVISION
5: TELEVISION C
FIG. 10
101 TUNER PART
102 DEMODULATION PART
103 DEMULTIPLEXING PART
104 IMAGE PROCESSING PART
105 DATA PROCESSING PART
106 DISPLAY PART
107 SOUND PROCESSING PART
108 VOICE RECEIVING PART
109 VOICE TRANSMITTING PART
110 COMMUNICATION PART
111 KEY OPERATION PART
112 LIGHT EMITTING PART (LED)
113 LIGHT EMISSION ADJUSTING PART
114 CHANNEL SCAN PART
115 MEMORY PART
116 CONTROL PART
117 AREA DETECTION PART
FIG. 11
ST201 RECEPTION AREA IS CHANGED?
ST202 START CHANNEL SCAN AUTOMATICALLY
ST203 ACQUIRE CHANNEL INFORMATION FROM BROADCAST STATION
ST204 STORE CHANNEL INFORMATION IN MEMORY
ST205 LIGHT UP LED CORRESPONDING TO CHANNEL SELECTION BUTTON OF VIEWABLE CHANNEL
ST206 DISPLAY LIST OF CHANNEL AND TELEVISION STATION
A1 VIEWING TELEVISION WHILE MOVING
A2 END

The invention claimed is:

1. A digital broadcast receiving apparatus comprising:
a receiver for receiving digital broadcast waves of specified channels,
a storing section that stores information of a channel capable of being watched;
a plurality of buttons including a first channel selection button and a second channel selection button; and
a control portion, which controls the first channel selection button to illuminate based on the information stored in the storing section, and which controls the second channel selection button not to illuminate based on the information stored in the storing section,
wherein the first channel selection is corresponding to the channel capable of being watched,
wherein the second channel selection is corresponding to a channel which is not capable of being watched,
wherein the control portion controls the first channel selection button to turn off the illumination when the control portion determines that the channel selection buttons are not touched for a predetermined time,
wherein the control portion controls the first channel selection button to continue to illuminate when the control portion determines that at least one of the plurality of buttons are touched repeatedly within the predetermined time, and
wherein, after the illumination of the first channel selection button is turned off, the control portion controls the first channel selection button to illuminate based on the information stored in the storing section when at least one of the plurality of buttons is touched.

2. The digital broadcast receiving apparatus as claimed in claim 1, comprising:
light emitting portions provided in correspondence with the channel selection buttons,
wherein the control portion makes the light emitting portions emit light to illuminate the channel selection buttons corresponding to the channels capable of being received by the receiver.

3. The digital broadcast receiving apparatus as claimed in claim 1, comprising:
a display portion,
wherein the control portion controls so as to be able to visually distinguish a channel selection button corresponding to a channel being displayed on the display portion from the channel selection buttons corresponding to a channel which is not being displayed, among the channel selection buttons corresponding to the channels capable of being received by the receiver.

4. The digital broadcast receiving apparatus as claimed in claim 2, comprising:
a detection portion for detecting a change of a reception area,
wherein when the detection portion detects the change, the control portion makes the light emitting portions of the channel selection buttons corresponding to channels capable of being received by the receiver in the changed area emit light.

5. The digital broadcast receiving apparatus as claimed in claim 3, wherein when a channel scan for detecting the channels capable of being received by the receiver is executed, the control portion makes the display portion display the channels capable of being received by the receiver and information related to broadcast stations of the channels in association with each other.

6. The digital broadcast receiving apparatus of claim 2, wherein the control portion makes the light emitting portion corresponding to the channel emit light at a light emission intensity in response to a reception state of the broadcast waves of each of the channels by the receiver.

7. The digital broadcast receiving apparatus of claim 2, wherein the light emitting portions emit light in a plurality of different colors, and the control portion makes the light emitting portion corresponding to the channel emit light in a color that corresponds to the reception state of the broadcast waves of each of the channels by the receiver.

8. The digital broadcast receiving apparatus as claimed in claim 2, comprising:
a display portion,
wherein the control portion controls so as to be able to visually distinguish a channel selection button corresponding to a channel being displayed on the display portion from the channel selection buttons corresponding to a channel which is not being displayed, among the channel selection buttons corresponding to the channels capable of being received by the receiver.

9. The digital broadcast receiving apparatus as claimed in claim 8, wherein when a channel scan for detecting the channels capable of being received by the receiver is executed, the control portion makes the display portion display the channels capable of being received by the receiver and information related to broadcast stations of the channels in association with each other.

10. The digital broadcast receiving apparatus as claimed in claim 3, comprising:
a detection portion for detecting a change of a reception area, wherein when the detection portion detects the change, the control portion makes the light emitting portions of the channel selection buttons corresponding to channels capable of being received by the receiver in the changed area emit light.

11. The digital broadcast receiving apparatus of claim 3, wherein the control portion makes the light emitting portion corresponding to the channel emit light at a light emission intensity in response to a reception state of the broadcast waves of each of the channels by the receiver.

12. The digital broadcast receiving apparatus of claim 4, wherein the control portion makes the light emitting portion corresponding to the channel emit light at a light emission intensity in response to a reception state of the broadcast waves of each of the channels by the receiver.

13. The digital broadcast receiving apparatus of claim 5, wherein the control portion makes the light emitting portion corresponding to the channel emit light at a light emission intensity in response to a reception state of the broadcast waves of each of the channels by the receiver.

14. The digital broadcast receiving apparatus of claim 3, wherein the light emitting portions emit light in a plurality of different colors, and the control portion makes the light emitting portion corresponding to the channel emit light in a color that corresponds to the reception state of the broadcast waves of each of the channels by the receiver.

15. The digital broadcast receiving apparatus of claim 4, wherein the light emitting portions emit light in a plurality of different colors, and the control portion makes the light emitting portion corresponding to the channel emit light in a color that corresponds to the reception state of the broadcast waves of each of the channels by the receiver.

16. The digital broadcast receiving apparatus of claim 5, wherein the light emitting portions emit light in a plurality of different colors, and the control portion makes the light emitting portion corresponding to the channel emit light in a color that corresponds to the reception state of the broadcast waves of each of the channels by the receiver.

17. The digital broadcast receiving apparatus of claim 6, wherein the light emitting portions emit light in a plurality of different colors, and the control portion makes the light emitting portion corresponding to the channel emit light in a color that corresponds to the reception state of the broadcast waves of each of the channels by the receiver.

18. The digital broadcast receiving apparatus as claimed in claim 1, further comprising:
 a display portion,
 wherein the control portion controls so as to be able to visually distinguish one of the first channel selection button based on a channel being displayed on the display portion, another first channel selection button corresponding to a channel not being displayed, and the second channel selection button, from each other.

19. The digital broadcast receiving apparatus as claimed in claim 1, further comprising:
 a display portion,
 wherein, when one of the channel selection buttons is touched as the first touch after the illumination is turned off, the first channel selection buttons is illuminated without changing a display of the display portion, and
 wherein, when one of the first channel selection buttons is touched after the first touch, the control portion displays a channel corresponding to the touched first channel selection button after the first touch, on the display portion.

20. The digital broadcast receiving apparatus as claimed in claim 1, further comprising:
 a display portion,
 wherein, when the first channel selection button is touched after the illumination is turned off, the control portion displays a channel corresponding to the touched first channel selection button after the first touch, on the display portion, wherein, when a button other than the first channel selection button is touched after the illumination is turned off, the control portion controls the first channel selection button to illuminate based on the information stored in the storing section.

\* \* \* \* \*